(12) United States Patent
Nakayama

(10) Patent No.: US 9,797,929 B2
(45) Date of Patent: Oct. 24, 2017

(54) WAVEFORM PROCESSING ASSISTANCE METHOD AND SYSTEM

(71) Applicant: SHIMADZU CORPORATION, Kyoto-shi, Kyoto (JP)

(72) Inventor: Daisuke Nakayama, Nagaokakyo (JP)

(73) Assignee: SHIMADZU CORPORATION, Kyoto-shi, Kyoto (JP)

( * ) Notice: Subject to any disclaimer, the term of this patent is extended or adjusted under 35 U.S.C. 154(b) by 435 days.

(21) Appl. No.: 14/485,961

(22) Filed: Sep. 15, 2014

(65) Prior Publication Data
US 2015/0081250 A1    Mar. 19, 2015

(30) Foreign Application Priority Data
Sep. 18, 2013 (JP) .................. 2013-192603

(51) Int. Cl.
*G01R 13/02* (2006.01)
(52) U.S. Cl.
CPC .................. *G01R 13/0245* (2013.01)
(58) Field of Classification Search
CPC .................. G01R 13/0245; H01J 49/0036
USPC .................. 702/189, 23; 600/300, 509, 523
See application file for complete search history.

(56) References Cited

U.S. PATENT DOCUMENTS

| | | | | |
|---|---|---|---|---|
| 5,954,666 | A | * | 9/1999 | Snell .................. A61B 5/0456 600/523 |
| 2003/0158466 | A1 | | 8/2003 | Lynn et al. |
| 2013/0338935 | A1 | * | 12/2013 | Watanabe ........... H01J 49/0036 702/23 |

FOREIGN PATENT DOCUMENTS

| | | |
|---|---|---|
| JP | 3-118467 A | 5/1991 |
| JP | 2003-296285 A | 10/2003 |
| JP | 2005-127814 A | 5/2005 |
| JP | 2006-47280 A | 2/2006 |

OTHER PUBLICATIONS

Communication dated Mar. 24, 2016 from the State Intellectual Property Office of the P.R.C. issued in corresponding Application No. 201410478965.1.
Working Principle of Chromatographic Data Processor, Chemical Analysis Instrument II, Department of Personnel and Education of Ministry of Chemical Industry et al., Chemical Industry Press, Mar. 1997, pp. 295 to 297, 5 pages total.

(Continued)

*Primary Examiner* — John H Le
(74) *Attorney, Agent, or Firm* — Sughrue Mion, PLLC

(57) ABSTRACT

Provided is a waveform processing assistance system for helping users determine the value of a parameter which is necessary in a waveform processing method for determining the rising and falling points of a peak and whose validity cannot be easily and intuitively determined The system includes: a waveform displayer for showing, on a display screen, a waveform including a peak; a marker displayer for showing, on the display screen, a marker which is capable of being moved by a user; and a slope information displayer for showing information related to the slope of the waveform at a point lying on the waveform and meeting the marker, or at a point which lies on the waveform, which meets the marker, and at which a predetermined operation has been performed by the user. Examples of the slope-related information include a numerical value of the slope, a tangent, and a grid.

7 Claims, 3 Drawing Sheets

(56) References Cited

OTHER PUBLICATIONS

Ma Lu-fang et al., "Application of Origin Software to Process Experimental Data of the Surface Tensions of Aqueous Solutions", Journal of Luoyang Normal University, Oct. 2010, vol. 29, No. 5, pp. 155 to 156, 3 pages total.
Chinese Office Action dated Aug. 25, 2015 in corresponding Chinese Patent Application No. 201410478965.1.
He Shiwen, Processing of Differential Scanning Calorimetry Experimental Data Using the Original Software, He Shiwen, Education for Chinese After-School, vol. 21, 2011, p. 286.
Ma Lufang et al., Processing of Surface Tension of Solution Experimental Data Using the Original Software, Journal of Luoyang Normal University, vol. 29, No. 5, 2010, p. 155.
Communication dated Nov. 1, 2016 from the Japanese Patent Office in counterpart application No. 2013-192603.
Communication dated May 30, 2017, issued by the Japanese Patent Office in counterpart application No. 2013-192603.

\* cited by examiner

WAVEFORM PROCESSING ASSISTANCE METHOD AND SYSTEM

TECHNICAL FIELD

The present invention relates to a method and system for assisting an analysis of a peak waveform of measurement data obtained with a chromatograph system, spectrometer or other devices.

BACKGROUND ART

Some measurement systems, such as a chromatograph system or a spectroscopic analyzer, produce measurement data in the form of waves with one or more peaks. In those systems, the result of a measurement is analyzed by determining the width, intensity, area and other values of a peak waveform of the measurement data by waveform processing including the steps of determining the rising and falling points of the peak, setting the baseline, and calculating a fitting curve using a Lorenz distribution function or Gaussian distribution function (see Patent Literature 1).

Correct determination of the rising and falling points of a peak is important since these points affect the value of the peak area. In a preparative chromatography, in which a specific target component in a sample being analyzed is preparative-separated based on the result of a chromatographic measurement, it is necessary to correctly determine the rising and falling points of the peak by waveform processing so as to minimize the amount of unwanted components to be mixed with the target component.

In a chromatograph system, two parameters called "Width" and "Slope" are used in the determination of the rising and falling points of a peak.

The parameter "Width" is the smallest value of the full width at half maximum (FWHM) by which a peak is identified in the waveform processing; a waveform whose FWHM is smaller than this value is identified as noise. The parameter "Width" is expressed in the same unit as the horizontal axis of the measurement data, e.g. in minutes as in the case of a chromatograph system or in 1/cm (or nm) as in the case of a spectroscopic analyzer. Therefore, users can intuitively determine whether or not the "Width" value is appropriate.

The parameter "Slope" is the critical value of the slope of a peak for locating the rising or falling point of the peak; the point at which the slope of the peak is equal to the critical value and around which the slope of the peak shows a predetermined increasing or decreasing tendency is identified as the rising or falling point of the peak. The parameter "Slope" is expressed in a complex unit in which the units of the horizontal and vertical axes are composed. Therefore, it is difficult for users to intuitively determine whether or not the "Slope" value is appropriate.

With such a technical background, efforts have been made to automatize the determination of the values of the two parameters (in particular, the determination of the "Slope" value) using a computer. In one method for determining an appropriate value of the "Slope", a recommended value of the "Slope" for a peak waveform of measurement data is automatically calculated by determining the baseline of the waveform with a predetermined criteria. In another method, the rising and falling points of an actual peak is calculated by an analysis using predetermined values of the parameters "Width" and "Slope."

The automatic determination of the values of the parameters "Width" and "Slope" using a computer is a standardized process and does not allow the rising or falling point of the peak to be arbitrarily selected as needed by users. For example, in a preparative chromatography, when a component other than a specific component has been found to be mixed in a preparative-separated sample, the user may desire to set the rising point of a peak at a later point in time and/or the falling point at an earlier point in time. However, the automatized process using a computer cannot flexibly deal with such situations. In such cases, the user needs to directly specify the values of the parameters "Width" and "Slope."

However, specifying the value of the parameter "Slope" is difficult for those who are not accustomed to an analysis for the waveform processing. This is because, as explained earlier, it is difficult for users to intuitively determine whether or not the "Slope" value is appropriate.

In a component analysis using spectra, there is the case where a plurality of spectra which only differ from each other in peak intensity need to be superposed on each other for comparison. In this case, a spectrum whose peak intensity is lower than those of the other spectra may be obscured in the vicinity of the baseline. When the user directly specifies the values of the parameters "Width" and "Slope" and determines the rising and falling points of a peak in such a low-intensity spectrum, it is difficult to determine, from the screen display, whether or not the rising and falling points of the peak are appropriate. Therefore, the user needs to perform the cumbersome task of expanding the vertical axis of the spectrum whose peak intensity is low and then determining the rising and falling points of the peak by directly specifying the values of the parameters "Width" and "Slope."

CITATION LIST

Patent Literature

Patent Literature 1: JP 2005-127814 A

SUMMARY OF INVENTION

Technical Problem

The problem to be solved by the present invention is to help users determine the value of a parameter which is necessary in a waveform processing method for determining the rising and falling points of a peak and whose validity cannot be easily and intuitively determined.

Solution to Problem

A waveform processing assistance method according to the present invention aimed at solving the previously described problem is characterized in that information related to the slope of a peak waveform of measurement data at a point specified by a user is shown on a display screen on which the peak waveform is shown.

The "information related to the slope" (which may be hereinafter called the "slope-related information") is one or more kinds of information selected from the group consisting of a numerical value of the slope, a tangent, and a grid. The specification of a point on a peak waveform by the user can be achieved, for example, by clicking a mouse at a desired point on a peak waveform shown on a display screen on which the peak waveform is shown, or by moving a cursor with cursor keys to a desired point on the peak waveform and performing a "specifying" operation at that point. If the display screen on which the peak waveform is shown is a touchscreen, the "specifying" operation can also be performed by touching a desired point on the screen with a pen-type input device (stylus pen) or a finger of the user. It is also possible to automatically select, as the "specified" point, a point on the peak waveform on which the mouse pointer or the cursor lies, without requiring the clicking or other special operation for the point specification.

When the position of the specified point on the peak waveform is changed, the display of the slope-related information also changes according to the change in the position. When the display range of the display screen is changed by some operation, such as the expanding of the vertical axis of the display screen on which the peak waveform is shown, the slope-related information such as the tangent and grid also changes according to that operation.

The grid minimally needs to include grid lines parallel to the tangent and may additionally include grid lines orthogonally or obliquely intersecting with the tangent.

A waveform processing assistance system according to the present invention aimed at solving the previously described problem includes:

a waveform displayer for showing, on a display screen, a waveform including a peak;

a marker displayer for showing, on the display screen, a marker which is capable of being moved by a user; and a slope information displayer for showing, on the display screen, information related to the slope of the waveform at a point lying on the waveform and meeting the marker, or at a point which lies on the waveform, which meets the marker, and at which a predetermined operation has been performed by the user.

In the waveform processing assistance system according to the present invention, a waveform including a peak is shown on the display screen by the waveform displayer, and a marker is also shown on the display screen by the marker displayer. The marker can be moved by users. The slope information displayer shows, on the display screen, slope information at the point where the marker meets the waveform on the display screen, or slope information at the point where the marker meets the waveform and at which a predetermined specifying operation has been performed by the user. Using this function, the user can make the system show slope information at any point on the waveform on the display screen.

The "information related to the slope" is one or more kinds of information selected from the group consisting of a (numerical) value of the slope, a tangent, and a grid. An input device (such as a mouse or stylus pen) can be used for allowing users to move the marker. If a touchscreen is provided as the display screen, the touchscreen can serve as an input device for moving the marker.

Advantageous Effects of the Invention

For a waveform including a peak of measurement data, the information related to the slope of the waveform at an arbitrarily specified point is displayed on the display screen on which the peak waveform is shown. This information helps users intuitively determine the value of the slope of the peak or other parameters whose validity has conventionally been difficult to be intuitively determined. Therefore, even a user who is not accustomed to an analysis for the waveform processing can perform an analysis of a peak waveform of the measurement data.

In the case where a plurality of spectra which only differ from each other in peak intensity are shown in a superposed form, the displayed information enables users to determine whether or not the rising and falling points of the peak in a spectrum are appropriate, even if the spectrum has a low peak intensity. Accordingly, the values of the parameters necessary for the waveform processing can be quickly specified and the analysis time of the waveform processing can be shortened.

DESCRIPTION OF EMBODIMENTS

Specific modes for carrying out the present invention are hereinafter described by means of embodiments.

First Embodiment

A waveform processing assistance system according to the first embodiment of the present invention is described with reference to FigS. 1 and 2.

Figure 1:
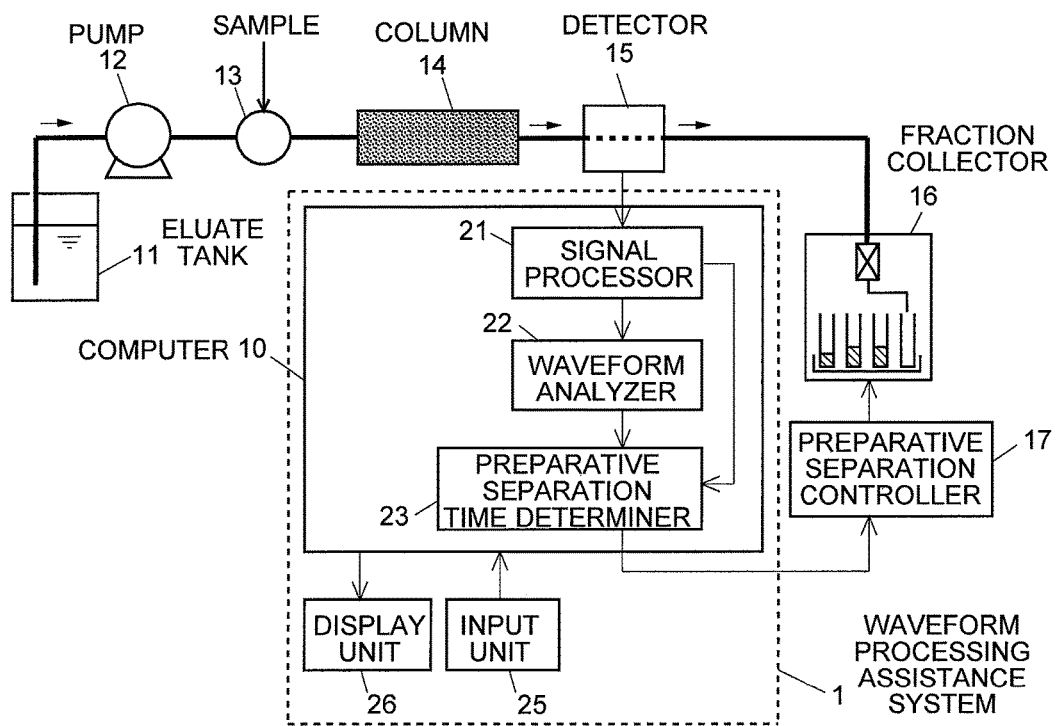
Fig. 1 is a block diagram showing the main components of a preparative chromatograph system.
Figure 2:
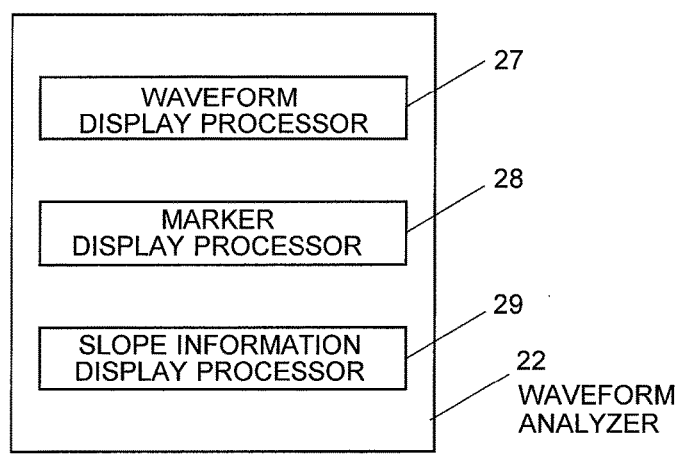
Fig. 2 is a block diagram showing the configuration of a waveform analyzer.

Fig. 1 is a block diagram showing the main components of a preparative liquid chromatograph system in which the waveform processing assistance system 1 of the present embodiment is used. An eluent (mobile phase) held in an eluent tank 11 is drawn by a liquid-sending pump 12 and supplied into a column 14 via a sample injector 13 at a constant flow rate. A sample solution injected into the mobile phase in the sample injector 13 is carried by the mobile phase and introduced into the column 14. While passing through this column 14, the sample is separated into components, which are eluted from the column 14 at different points in time. A detector 15, which is an ultraviolet-visible spectrophotometer, sequentially detects the components eluted from the column 14 and sends detection signals to a signal processor 21. After passing through the detector 15, the eluate is partially or entirely introduced into a fraction collector 16. The signal processor 21 creates a chromatogram based on the detection signals received from the detector 15.

Based on the peak waveform of the created chromatogram, the user needs to specify a section to be preparative-separated. As will be hereinafter described, the operator's workload in the waveform processing for the determination of the section for the preparative separation can be reduced by using the waveform processing assistance system 1, which consists of a computer 10 having a predetermined processing program installed, an input unit 25 including an input device, and a display unit 26 having a display screen. The computer 10 has the aforementioned signal processor 21, a waveform analyzer 22 and a preparative separation time determiner 23.

Initially, a waveform display processor 27 of the waveform analyzer 22 displays, on the display screen of the display unit 26, the chromatogram created by the signal processor 21, so as to let a user of the waveform processing assistance system 1 specify the rising and falling points of the peak based on the two parameters "Width" and "Slope."

Figure 3:
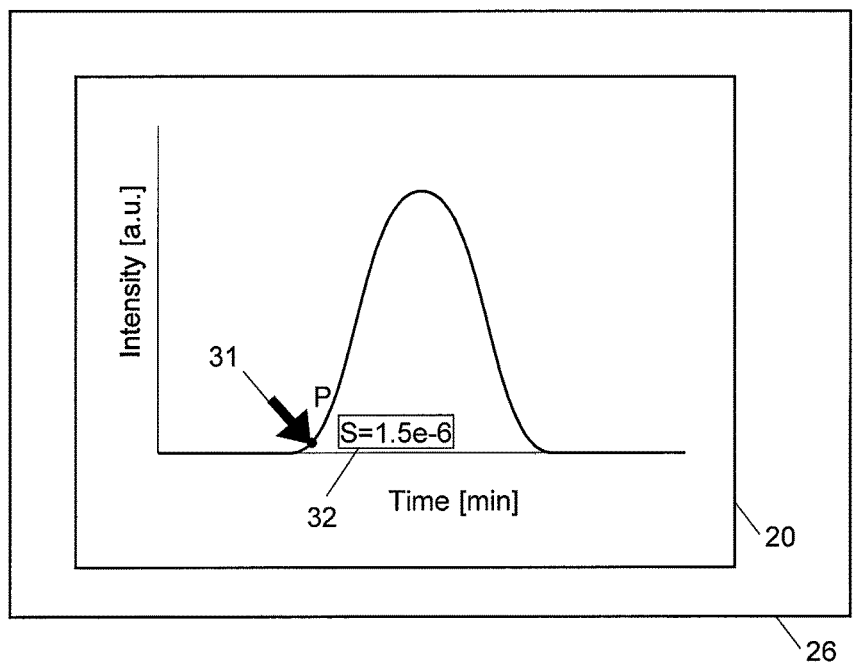
Fig. 3 shows one example of the display screen on which a peak waveform of a chromatogram in the first embodiment of the present invention is displayed.

One example of the display screen on which a peak waveform of a chromatogram is displayed is shown in Fig. 3. The display screen of the display unit 26 has a screen area 20 for showing a peak waveform of a chromatogram, with the horizontal axis indicating time and the vertical axis indicating the intensity. A mouse pointer 31 is displayed on the screen area 20 by a marker display processor 28 of the waveform analyzer 22. The display screen in the present example shows the situation where the user has moved the mouse pointer 31 to a point P on the peak waveform and clicked the mouse to specify the rising point of the peak.

When the user moves the mouse pointer 31 to a point P on the peak waveform and clicks a button of the mouse, a slope information display processor 29 of the waveform analyzer 22 immediately calculates the value of the slope of the waveform at the point P specified by the user, based on the waveform data, and displays the calculated slope value (numerical value) 32 near the point P. The slope value (numerical value) may be displayed at a different position which is not near the point P yet easy to view, e.g. at the upper right corner of the screen.

In the present embodiment, a mouse is used as the input unit 25 and the rising point of the peak is specified when the mouse is clicked by the user. If the display unit 26 has a touchscreen, the point P on the waveform can be specified by touching the screen with a stylus pen or a finger of the user, or by a similar method. It is also possible to automatically select, as the specified point, the point on the peak waveform on which the mouse pointer 31 currently lies, without requiring the clicking or other special operation for the point specification.

If the position of the specified point is changed by the user, the waveform analyzer 22 immediately recalculates the slope value according to the change and updates the slope-related information with the new slope value 32 calculated for the new position.

Thus, the slope value 32 at the point specified by the user is displayed in real time as the slope-related information on the display screen on which the peak waveform is shown. Therefore, the user can intuitively determine the value of the parameter.

Based on the slope-related information thus displayed, the user determines the rising and falling points of the peak waveform. Then, based on the information of the specified rising and falling points of the peak waveform, the preparative separation time determiner 23 determines the point in time to begin or end the preparative separation by the fraction collector 16, and sends control signals to a preparative separation controller 17. The preparative separation controller 17 opens or closes an electromagnetic valve (preparative separation valve) of the fraction collector 16 according to the control signals so that the components in the eluate are separately and individually collected in different vial containers. Thus, the entire sequence of the process performed by the preparative liquid chromatograph is completed.

Second Embodiment

Figure 4:
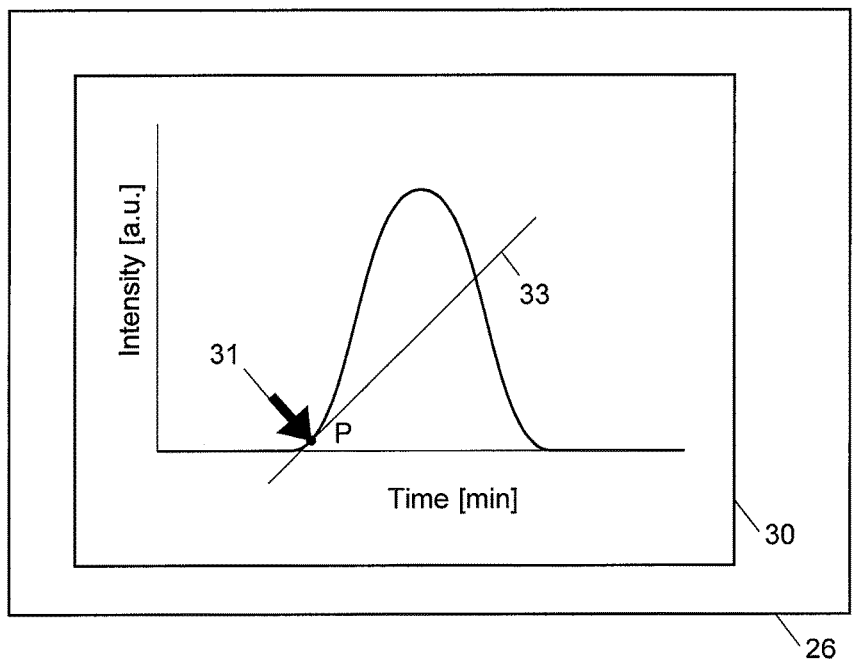
Fig. 4 shows one example of the display screen on which a peak waveform of a chromatogram in the second embodiment of the present invention is displayed.

The second embodiment of the present invention is hereinafter described by means of Fig. 4, which shows one example of the display screen on which a peak waveform of a chromatogram is shown. The following description only deals with the operation of the waveform analyzer 22, since the other operations are the same as in the first embodiment.

The display screen of the display unit 26 has a screen area 30 for showing a peak waveform of a chromatogram, with the horizontal axis indicating time and the vertical axis indicating the intensity. The display screen in the present example shows the situation where the user has specified a point P on the peak waveform as the rising point of the peak in the screen area 30.

When a point P on the peak waveform is specified by the user, the slope information display processor 29 of the waveform analyzer 22 determines the slope of the waveform at the specified point P, calculates a tangent 33 to the curve at the point P, and displays the tangent on the screen.

If the position of the specified point is changed by the user, the slope information display processor 29 of the waveform analyzer 22 immediately recalculates the tangent according to the change and redisplays the tangent 33 at the new point as the slope-related information. Thus, the tangent 33 at the point specified by the user is displayed in real time as the slope-related information on the display screen on which the peak waveform is shown. Therefore, the user can intuitively determine the value of the parameter.

When the display range of the screen area 30 is changed as a result of some operation, such as the expanding of the vertical axis of the screen area 30, the slope information display processor 29 of the waveform analyzer 22 immediately recalculates the position of the point P, the slope of the tangent at the point P and other relevant values, and redisplays the waveform and the tangent 33. The operation of expanding (or contracting) the vertical axis on the display screen and redisplaying the waveform may be applied to the entire screen area 30 or only to a specific peak among a plurality of peaks displayed in a superposed form on the screen area 30. The displayed information enables users to determine whether or not the rising and falling points of the peak in a spectrum is appropriate, even if the spectrum has a low peak intensity. This is convenient, for example, when a plurality of spectra which only differ from each other in peak intensity are shown in a superposed form on the screen area 30. Since the values of the parameters necessary for the waveform processing can be quickly specified, the analysis time of the waveform processing can be shortened.

Third Embodiment

The third embodiment of the present invention is hereinafter described by means of Fig. 5, which shows one example of the display screen on which a peak waveform of a chromatogram is shown. The following description only deals with the operation of the waveform analyzer 22, since the other operations are the same as in the first embodiment.

The display screen of the display unit 26 has a screen area 40 for showing a peak waveform of a chromatogram, with the horizontal axis indicating time and the vertical axis indicating the intensity. The display screen in the present example shows the situation where the user has specified a point P on the peak waveform as the rising point of the peak in the screen area 40.

When a point P on the peak waveform is specified by the user, the slope information display processor 29 of the waveform analyzer 22 immediately calculates the tangent to the curve at the point P and displays the tangent on the screen. Furthermore, the processor 29 also displays a grid 34 including a set of grid lines parallel to the tangent and another set of grid lines each of which is symmetrical with the tangent with respect to the vertical axis.

If the position of the specified point is changed by the user, the slope information display processor 29 of the waveform analyzer 22 immediately recalculates the tangent according to the change and redisplays, as the slope-related information, the grid 34 parallel to and symmetrical with the tangent at the new point. Thus, the grid 34 parallel to the tangent to the waveform at the point specified by the user is displayed in real time as the slope-related information on the display screen on which the peak waveform is shown. Therefore, the user can intuitively determine the value of the parameter.

When the display range of the screen area 40 is changed as a result of some operation, such as the expanding of the vertical axis of the screen area 40, the slope information display processor 29 of the waveform analyzer 22 immediately recalculates the slope of the grid lines and other relevant values, and redisplays the grid 34 on the screen area 40 according to the change of the display range. The displayed information enables users to determine whether or not the rising and falling points of the peak in a spectrum are appropriate, even if the spectrum has a low peak intensity. This is convenient, for example, when a plurality of spectra which only differ from each other in peak intensity are shown in a superposed form on the screen area 40. Since the values of the parameters necessary for the waveform processing can be quickly specified, the analysis time of the waveform processing can be shortened.

Figure 5:
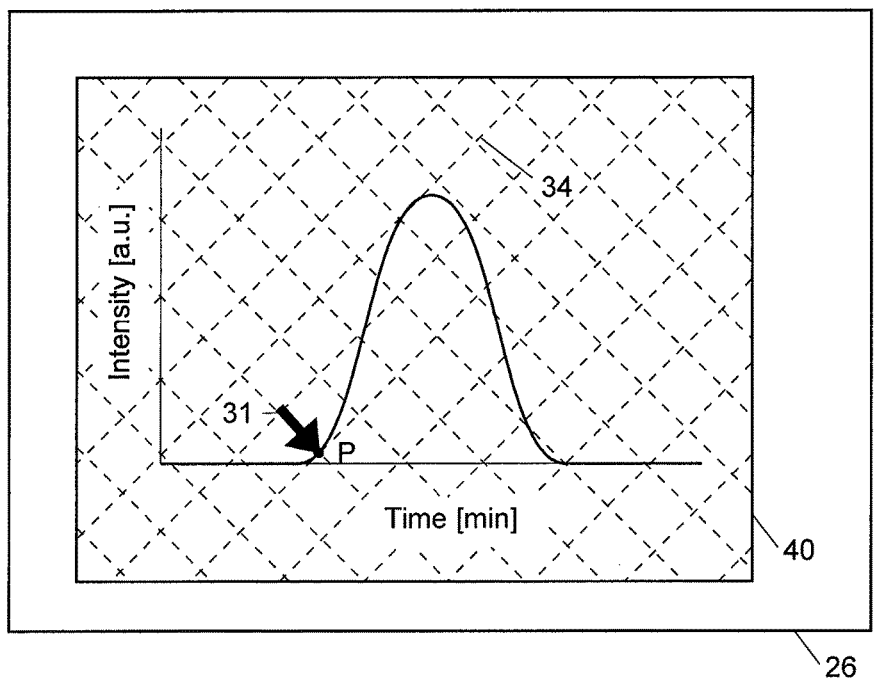
Fig. 5 shows one example of the display screen on which a peak waveform of a chromatogram in the third embodiment of the present invention is displayed.

In Fig. 5, the grid 34 includes a set of grid lines parallel to the tangent and another set of grid lines each of which is symmetrical with the tangent. As another example, the second set of grid lines may be orthogonal to the tangent. It is also possible to use only the grid lines parallel to the tangent.

The present invention is not limited to the case where one of the first through third embodiments is independently carried out, i.e. to the case where either the numerical value of the slope, the tangent or the grid is displayed as the slope-related information. The previously described embodiments can be combined; that is to say, it is possible to display two kinds of information selected from the group consisting of the numerical value of the slope, the tangent, and the grid, or to display all of the three kinds of information.

REFERENCE SIGNS LIST

1 . . . Waveform Processing Assistance System
20, 30, 40 . . . Screen Area
21 . . . Signal Processor
22 . . . Waveform Analyzer
23 . . . Preparative Separation Time Determiner
25 . . . Input Unit
26 . . . Display Unit
27 . . . Waveform Display Processor
28 . . . Marker Display Processor
29 . . . Slope Information Display Processor
31 . . . Mouse Pointer
32 . . . Slope Value
33 . . . Tangent
34 . . . Grid

The invention claimed is:

1. A chromatograph analysis method comprising:
conducting a chromatograph analysis including obtaining measurement data of components of a sample;
creating a chromatogram from the measurement data;
displaying the chromatogram on a display screen, the chromatogram including a peak waveform;
allowing a user to specify a point on the peak waveform of the chromatogram displayed on the display screen;
determining by a processor information related to a slope of the peak waveform of the measurement data at the point specified by the user; and
displaying the chromatogram on the display screen with the information related to the slope of the peak waveform at the point specified by the user on the display screen,
wherein the information related to the slope is one or more kinds of information selected from a group consisting of a tangent and a grid including grid lines parallel to the tangent.

2. The chromatograph analysis method according to claim 1, wherein the point is a position of a mouse pointer on the display screen.

3. The chromatograph analysis method according to claim 1, wherein the grid further includes grid lines symmetrical to the tangent with respect to a vertical axis.

4. The chromatograph analysis method according to claim 1, wherein when the display range of the screen area showing the peak waveform is changed as a result of expanding or contracting the vertical axis, the grid is redisplayed according to the change of the display range.

5. A chromatograph system, comprising:
a chromatograph including a detector that obtains measurement data of components of a sample;
a display screen;
a signal processor that creates a chromatogram from the measurement data;
a display processor that displays the chromatogram on the display screen;
an input unit for allowing a user to specify a point on a waveform of the chromatogram displayed on the display screen; and
a wave processor, including
a waveform displayer for showing, on the display screen, the waveform including a peak;
a marker displayer for showing, on the display screen, a marker which is capable of being moved by the user to specify the point on the waveform; and
a slope information display processor for determining information related to a slope of the peak waveform of the measurement data at the point specified by the user and for showing, on the display screen, the information related to the slope of the waveform at the point lying on the waveform and meeting the marker, or at a point which lies on the waveform, which meets the marker, and at which a predetermined specifying operation has been performed by the user,
wherein the information related to the slope is one or more kinds of information selected from a group consisting of a tangent and a grid including grid lines parallel to the tangent.

6. The chromatograph system according to claim 5, wherein the grid further includes grid lines symmetrical to the tangent with respect to a vertical axis.

7. The chromatograph system according to claim 5, wherein when the display range of the screen area showing the peak waveform is changed as a result of expanding or contracting the vertical axis, the grid is redisplayed according to the change of the display range.

* * * * *